US008385380B2

(12) United States Patent
Leatherdale et al.

(10) Patent No.: US 8,385,380 B2
(45) Date of Patent: Feb. 26, 2013

(54) MONOCHROMATIC LIGHT SOURCE

(75) Inventors: Catherine A. Leatherdale, Woodbury, MN (US); Michael A. Haase, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 110 days.

(21) Appl. No.: 13/060,643

(22) PCT Filed: Jul. 28, 2009

(86) PCT No.: PCT/US2009/051920
§ 371 (c)(1),
(2), (4) Date: Feb. 24, 2011

(87) PCT Pub. No.: WO2010/027581
PCT Pub. Date: Mar. 11, 2010

(65) Prior Publication Data
US 2011/0150019 A1      Jun. 23, 2011

Related U.S. Application Data

(60) Provisional application No. 61/094,267, filed on Sep. 4, 2008.

(51) Int. Cl.
*H01S 5/00* (2006.01)
(52) U.S. Cl. ............... 372/50.11; 372/50.121; 372/50.1; 372/45.013; 372/45.01
(58) Field of Classification Search ............... 372/50.11, 372/50.121, 50.1, 45.013, 45.01
See application file for complete search history.

(56) References Cited

U.S. PATENT DOCUMENTS

| | | | |
|---|---|---|---|
| 5,258,990 A * | 11/1993 | Olbright et al. | .......... 372/50.124 |
| 5,818,859 A | 10/1998 | Miller | |
| 5,955,749 A | 9/1999 | Joannopoulos | |
| 5,974,070 A | 10/1999 | Haase | |
| 6,366,018 B1 | 4/2002 | Garbuzov | |
| 6,831,302 B2 | 12/2004 | Erchak | |
| 6,873,638 B2 | 3/2005 | Haase | |
| 7,122,843 B2 | 10/2006 | Kahen | |

(Continued)

FOREIGN PATENT DOCUMENTS

| | | |
|---|---|---|
| DE | 10 2007 003 785 | 7/2008 |
| EP | 1 403 934 | 9/2003 |

(Continued)

OTHER PUBLICATIONS

Hovinen, "Blue-green Laser Emission from ZnSe Quantum Well Microresonators", Appl. Phys. Lett., Dec. 6, 1993, vol. 63, No. 23, pp. 3128-3130.

(Continued)

*Primary Examiner* — Kinam Park
(74) *Attorney, Agent, or Firm* — Kristofor L. Storvick

(57) ABSTRACT

Light emitting systems are disclosed. The light emitting system includes an electroluminescent device that emits light at a first wavelength. The light emitting system further includes an optical cavity that enhances emission of light from a top surface of the light emitting system and suppresses emission of light from one or more sides of the light emitting system. The optical cavity includes a semiconductor multilayer stack that receives the emitted first wavelength light and converts at least a portion of the received light to light of a second wavelength. The semiconductor multilayer stack includes a II-VI potential well. The integrated emission intensity of all light at the second wavelength that exit the light emitting system is at least 10 times the integrated emission intensity of all light at the first wavelength that exit the light emitting system.

14 Claims, 7 Drawing Sheets

U.S. PATENT DOCUMENTS

| | | | |
|---|---|---|---|
| 7,196,354 | B1 | 3/2007 | Erchak |
| 7,361,938 | B2 | 4/2008 | Mueller |
| 7,462,878 | B2 | 12/2008 | Richter |
| 7,863,634 | B2 | 1/2011 | Haase |
| 8,193,543 | B2 | 6/2012 | Leatherdale |
| 2004/0013154 | A1 | 1/2004 | Zheng |
| 2004/0041220 | A1 | 3/2004 | Kwak |
| 2004/0179566 | A1 | 9/2004 | El-Bahar |
| 2005/0110034 | A1 | 5/2005 | Fujiwara |
| 2005/0276295 | A1 | 12/2005 | Kahen |
| 2005/0276301 | A1 | 12/2005 | Spinelli |
| 2006/0054905 | A1 | 3/2006 | Schwach |
| 2006/0078031 | A1 | 4/2006 | Govorkov |
| 2006/0145123 | A1 | 7/2006 | Li |
| 2006/0157720 | A1 | 7/2006 | Bawendi |
| 2006/0214917 | A1 | 9/2006 | Liu |
| 2007/0108888 | A1 | 5/2007 | Chen |
| 2007/0176188 | A1 | 8/2007 | Tanaka |
| 2007/0267646 | A1 | 11/2007 | Wierer |
| 2007/0284567 | A1 | 12/2007 | Pokrovskiy |
| 2007/0291808 | A1 | 12/2007 | Ledentsov |
| 2010/0117997 | A1* | 5/2010 | Haase ............... 345/204 |
| 2010/0277054 | A1 | 11/2010 | Takashima |
| 2010/0283074 | A1 | 11/2010 | Kelley |
| 2011/0121319 | A1 | 5/2011 | Haase |
| 2011/0140129 | A1 | 6/2011 | Leatherdale |
| 2011/0150020 | A1 | 6/2011 | Haase |
| 2011/0156002 | A1 | 6/2011 | Leatherdale |

FOREIGN PATENT DOCUMENTS

| | | |
|---|---|---|
| EP | 1 411 557 | 10/2003 |
| EP | 1 643 567 | 8/2005 |
| GB | 2 451 365 | 1/2009 |
| JP | 5343796 | 12/1993 |
| JP | 7-249835 | 9/1995 |
| JP | 11274565 | 10/1999 |
| JP | 2007-103511 | 4/2007 |
| JP | 2007-273506 | 10/2007 |
| JP | 11-330559 | 11/2009 |
| WO | 03/003083 A2 | 1/2003 |
| WO | 2006/135005 | 12/2006 |
| WO | 2007/007236 | 6/2007 |
| WO | 2007/073449 | 6/2007 |
| WO | 2008/078299 | 7/2008 |
| WO | WO 2010/027580 | 3/2010 |
| WO | WO 2010/027648 | 3/2010 |
| WO | WO 2010/027649 | 3/2010 |
| WO | WO 2010/027650 | 3/2010 |

OTHER PUBLICATIONS

Jeon, "Room-temperature Optically Pumped Blue-green Vertical Cavity Surface Emitting Laser", Appl. Phys. Lett., Sep. 18, 1995, vol. 67, No. 12, pp. 1668-1670.

Knopp, "Vertical-cavity Surface-emitting Lasers with Low-ripple Optical Pumping Windows", IEEE Journ. of Selected Topics in Quantum Electron., Apr. 1997, vol. 3, No. 2, pp. 366-371.

Kruse, "High Reflectivity p-Type Doped Distributed Bragg Reflectors Using ZnSe/MgS Superlattices", Phys. Stat. Sol. (b), 2002, vol. 229, No. 1, pp. 111-115.

Lin, "$N$-type Doping of Lattice-matched ZnCdSe and $Zn_xCd_yMg1-x-y$Se Epilayers on InP Using $ZnCl_2$", Journ. of Applied Physics, Aug. 1, 1998, vol. 84, No. 3, pp. 1472-1475.

Song, "A Quasicontinuous Wave, Optically Pumped Violet Vertical Cavity Surface Emitting Laser", Applied Physics Letters, Mar. 27, 2000, vol. 76, No. 13, pp. 1662-1664.

Sorokin, "(ZnSe/MgS)/ZnCdSe DBRs Grown by Molecular Beam Epitaxy Using ZnS as a Sulphur Source", Phys. Stat. Sol. (c), 2006, vol. 3, No. 4, pp. 763-766.

Venkatasubramanian, "Selective Plasma Etching of Ge Substrates for Thin Freestanding GaAs-AlGaAs Heterostructures", Applied Physics Letters, Oct. 21, 1991, vol. 59, No. 17, pp. 2153-2155.

Zeng, "Red-green-blue Photopumped Lasing from ZnCdMgSe/ZnCdSe Quantum Well Laser Structures Grown on InP", Applied Physics Letters, Jun. 15, 1998, vol. 72, No. 24, pp. 3136-3138.

International Search Report for PCT/US2009/051920, 3 pgs.

Written Opinion of the ISA for International Application PCT/US2009/051920, 3 pgs.

Delbeke, "High Efficiency Semiconductor Resonant-Cavity Light-Emitting Diodes: A Review", IEEE Journal on Selected Topics in Quantum Electronics, pp. 189-206, vol. 8, No. 2, Mar./Apr. 2002.

Hastie, "High Power CW Red VECSEL With Linearly Polarized TEM00 Output Beam", Optics Express, Jan. 10, 2005, vol. 13, No. 1, pp. 77-81.

Kruse, "Investigation of Green Emitting Monolithic II-VI Vertical Cavity Surface Emitting Laser", Mat. Res. Soc. Symp. Proc., 2002, vol. 722, pp. K4.7.1-K4.7.6.

MacLean, "Continuous Tuning and Efficient Intracavity Second-harmonic Generation in a Semiconductor Disk Laser with an Intracavity Diamond Heatspreader", IEEE Journ. of Quantum Electron., Mar. 2008, vol. 44, No. 3, pp. 216-225.

Shen, "Optical cavity effects in InGaN/GaN quantum-well-heterostructure flip-chip light-emitting diodes," Applied Physics Letters, vol. 82, No. 14, pp. 2221-2223 (2003).

Sorokin, "High Efficiency Integral III-N/II-VI Blue-green Laser Converter", Electronics Letters, Feb. 1, 2007, vol. 43, No. 3, pp. 162-163.

Stillman, "Volume Excitation of an Ultrathin Single-mode CdSe Laser", Applied Physics Letters, Oct. 1, 1966, vol. 9, No. 7, pp. 268-269.

Tai, "Room-temperature continuous-wave vertical-cavity surface-emitting GaAs injection lasers", Applied Physics Letters, vol. 55, No. 24, pp. 2473-2475, Dec. 1989.

Tong, "Semiconductor Wafer Bonding", Title Page and Table of Contents, John Wiley & Sons, New York, 1999.

* cited by examiner

MONOCHROMATIC LIGHT SOURCE

CROSS REFERENCE TO RELATED APPLICATIONS

This application is a national stage filing under 35 U.S.C. 371 of PCT/US2009/051920, filed on Jul. 28, 2009, which claims priority to U.S. Provisional Application No. 61/094,267 filed on Sep. 4, 2008, the disclosure of which is incorporated by reference in its/their entirety herein.

FIELD OF THE INVENTION

This invention generally relates to semiconductor light sources. The invention is particularly applicable to semiconductor light sources that include one or more II-VI semiconductor compounds.

BACKGROUND

Laser diodes are used in many different applications such as laser pointers, projection displays, and sensors. Laser diodes that emit in the near UV, violet, near infrared, or infrared regions of the spectrum can be compact and inexpensive. In other regions of the spectrum, however, known laser diodes, such as frequency doubled laser diodes, are complicated, bulky, inefficient, and expensive. There is a great need for a compact, efficient, and inexpensive laser diode system capable of emitting at other desirable wavelengths, such as in the cyan, green, charteuse, yellow and amber regions of the spectrum.

SUMMARY OF THE INVENTION

Generally, the present invention relates to semiconductor light sources. In one embodiment, a light source includes a III-V based pump light source that includes nitrogen and emits light at a first wavelength. The light source further includes a vertical cavity surface emitting laser (VCSEL) that converts at least a portion of the first wavelength light emitted by the pump light source to at least a partially coherent light at a second wavelength. The VCSEL includes first and second mirrors that form an optical cavity for light at the second wavelength. The first mirror is substantially reflective at the second wavelength and includes a first multilayer stack. The second mirror is substantially transmissive at the first wavelength and partially reflective and partially transmissive at the second wavelength. The second mirror includes a second multilayer stack. The VCSEL further includes a semiconductor multilayer stack that is disposed between the first and second mirrors and converts at least a portion of the first wavelength light to the second wavelength light. The semiconductor multilayer stack includes a quantum well that includes a Cd(Mg)ZnSe alloy.

In another embodiment, a light source includes a III-V based pump light source that includes nitrogen N and emits light at a first wavelength. The light source further includes an optical assembly that converts at least a portion of the first wavelength light emitted by the pump light source to at least a partially coherent light at a second wavelength. The optical assembly includes first and second mirrors that form an optical cavity for light at the second wavelength. The first mirror is substantially reflective at the second wavelength and includes a first multilayer stack. The second mirror is partially reflective at the second wavelength. The optical assembly further includes a semiconductor multilayer stack that is disposed between the first and second mirrors and converts at least a portion of the first wavelength light to the second wavelength light. The semiconductor multilayer stack includes a quantum well that includes a Cd(Mg)ZnSe alloy.

In another embodiment, a light emitting system includes an electroluminescent device that emits light at a first wavelength. The light emitting system further includes an optical cavity that enhances emission of light from a top surface of the light emitting system and suppresses emission of light from one or more sides of the light emitting system. The optical cavity includes a semiconductor multilayer stack that receives the emitted first wavelength light and converts at least a portion of the received light to light of a second wavelength. The semiconductor multilayer stack includes a II-VI potential well. The integrated emission intensity of all light at the second wavelength that exit the light emitting system is at least 10 times the integrated emission intensity of all light at the first wavelength that exit the light emitting system. In some cases, the II-VI potential well includes Cd(Mg)ZnSe or ZnSeTe. In some cases, the electroluminescent device is so designed that a substantial portion of the first wavelength light that is received by the semiconductor multilayer stack, exits the electroluminescent device through a top surface of the electroluminescent device. In some cases, light that is emitted by the light emitting system along a first direction has a first set of color coordinates and light that is emitted by the light emitting system along a second direction different than the first direction has a second set of color coordinates, where the second set of color coordinates is substantially the same as the first set of color coordinates. In some cases, the first set of color coordinates are $u_1'$ and $v_1'$ and the second set of color coordinates are $u_2'$ and $v_2'$, and the absolute value of each of differences between $u_1'$ and $u_2'$ and between $v_1'$ and $v_2'$ is no more than 0.003. In some cases, a primary portion of the re-emitted second wavelength light exits the light emitting system from a top surface of the light emitting system. The top surface has a minimum lateral dimension $W_{min}$. A substantial fraction of the remaining portion of the re-emitted second wavelength light exits the light emitting system from one or more sides of the optical cavity that have a maximum edge thickness $T_{max}$. The ratio $W_{min}/T_{max}$ is at least about 30. A primary portion of the emitted first wavelength light exits the electroluminescent device from a top surface of the electroluminescent device. The top surface has a minimum lateral dimension $W1_{min}$. The remaining portion of the emitted first wavelength light exits the electroluminescent device from one or more sides of the electroluminescent device that have a maximum edge thickness $T1_{max}$. The ratio $W1_{min}/T1_{max}$ is at least about 30. In some cases, each of the ratios $W_{min}/T_{max}$ and $W1_{min}/T1_{max}$ is at least about 100.

BRIEF DESCRIPTION OF DRAWINGS

The invention may be more completely understood and appreciated in consideration of the following detailed description of various embodiments of the invention in connection with the accompanying drawings, in which.

The same reference numeral used in multiple figures refers to the same or similar elements having the same or similar properties and functionalities.

DETAILED DESCRIPTION

Figure 1:
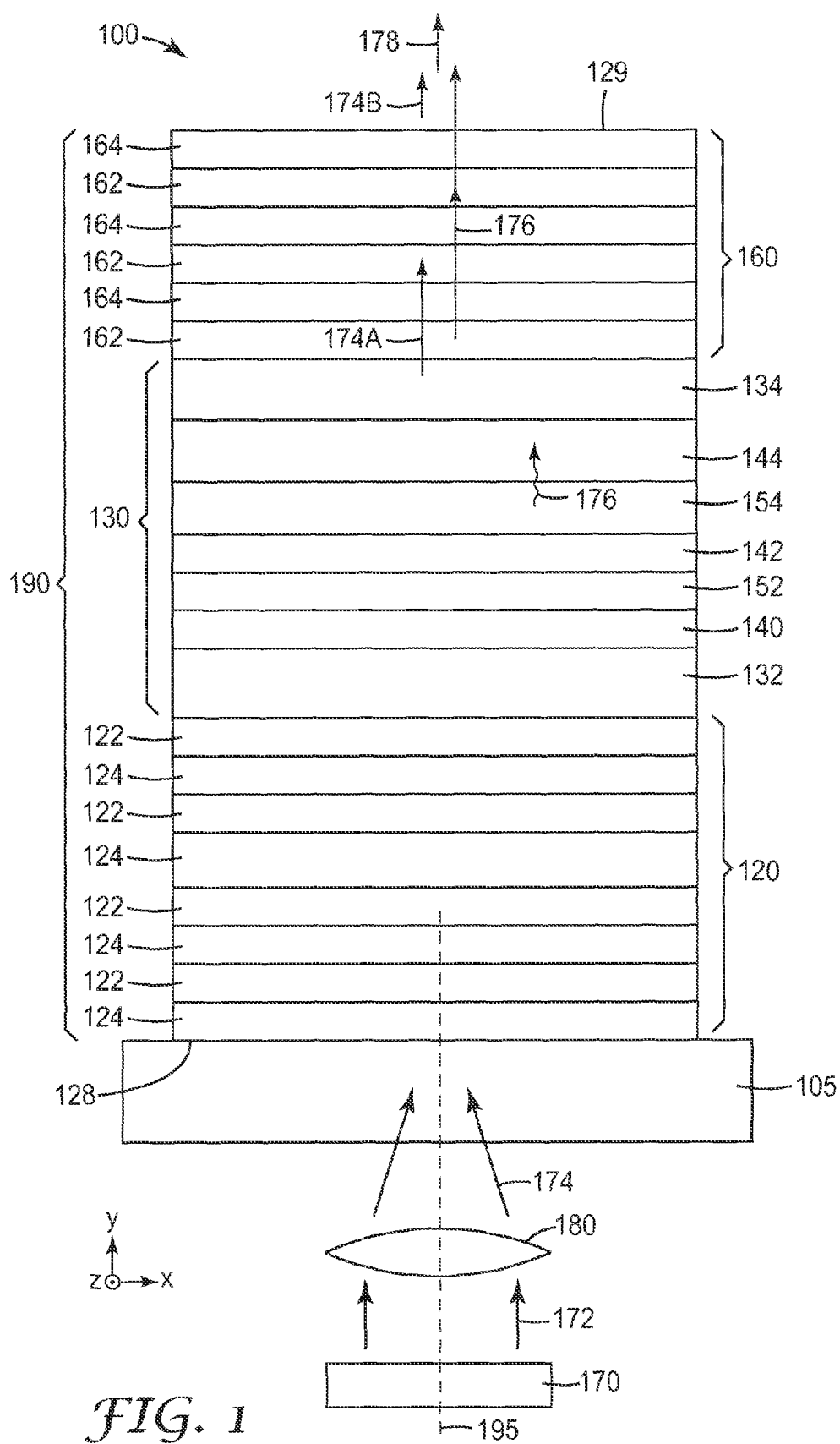
FIG. 1 is a schematic side-view of a light source.

This application discloses semiconductor light sources that include one or more pump light sources and one or more semiconductor optical cavities for converting light emitted by a pump light source to a different wavelength light. In some cases, a disclosed semiconductor optical cavity is a resonant-cavity capable of converting, such as down converting, an incident light. In some cases, a disclosed semiconductor resonant-cavity wavelength converter is a vertical cavity surface emitting laser (VCSEL). The disclosed light sources are efficient, compact, and in some cases, inexpensively integrate a light converting VCSEL with a pump light source from two or more different semiconductor groups. For example, this application discloses a light source that integrates a III-V pump light source, such as a pump light source that includes N, such as a AlGaInN pump LED or a laser diode, with a II-VI VCSEL that includes a II-VI semiconductor wavelength converter, such as a Cd(Mg)ZnSe wavelength converter.

In some cases, the pump light source, such as a laser diode (LD) light source, is at least a partially coherent light source, meaning that it emits at least partially coherent light. In some cases, the pump light source, such as a light emitting diode (LED) light source, is an incoherent light source, meaning that it emits incoherent light.

In some cases, the semiconductor VCSEL and the pump light source are from the same semiconductor group, such as the III-V group. In such cases, it may be feasible to monolithically grow and fabricate, for example, a III-V VCSEL directly onto a III-V pump light source, such as a III-V pump. In some cases, however, a VCSEL that emits light at a desired wavelength and has high conversion efficiency and/or other desirable properties, is from a semiconductor group that is different than the group the pump LD or LED belongs to. For example, a VCSEL can be from the II-VI group and a light source, such as an LD or LED, can be from the III-V group. In such cases, it may not be possible or feasible to grow one component onto the other with high quality. In such cases, the VCSEL can be attached to the pump light source to form a hybrid light source. Such hybrid light sources can emit light with high overall efficiency at different wavelengths in, for example, the visible region of the spectrum. Exemplary methods of attaching two constructions are described in U.S. Patent Application Ser. No. 60/978,304, filed Oct. 8, 2007, which is incorporated herein in its entirety by reference.

In some cases, the disclosed light sources can output, for example, one or more primary colors such as blue, green, or red in the RGB primary color system or cyan, magenta, and yellow in the CMYK primary color system. In some cases, the disclosed light sources can output light having other colors, such as amber or white. The emission efficiency and compactness of the disclosed light sources can lead to new and improved optical systems, such as efficient projection systems, with reduced weight, size, and power consumption.

In some cases, the VCSEL can include a potential or quantum well, such as a semiconductor potential or quantum well, that can convert light to a longer wavelength light. In some cases, the disclosed light sources efficiently integrate one or more VCSELs from a semiconductor group, such as the II-VI group, with one or more pump light sources, such as pump LDs or LEDs, from a different semiconductor group, such as the III-V group.

An array of light sources is disclosed that include an array of pump light sources and a corresponding array of VCSELs. Such an array of light sources can form monochromatic (for example, green or green and black) or color images. The disclosed arrays of light sources can combine the primary functions of conventional light sources and image forming devices resulting in reduced power consumption, size, and cost. For example, in a display system, a disclosed array of light sources can function as both the light source and the image forming device, thereby eliminating or reducing the need for a separate backlight or a spatial light modulator. As another example, incorporating the disclosed array of light sources in a projection system eliminates or reduces the need for image forming devices and relay optics.

Array of light sources is disclosed that can form, for example, an array of pixels in a display system. At least some of the light sources include a pump electroluminescent device, such as a pump LD or LED, that is capable of emitting light in response to an electric signal. At least some of the light sources can include one or more VCSELs that include one or more light converting elements, such as one or more potential wells and/or quantum wells, for down converting light that is emitted by the pump electroluminescent devices. As used herein, down converting means that the photon energy of the converted light is less than the photon energy of the pump light, or that the wavelength of the converted light is longer than the wavelength of the unconverted or incident light.

The disclosed arrays of light sources can be used in, for example, illumination systems, such as adaptive illumination systems, for use in, for example, projection systems or other optical systems.

FIG. 1 is a schematic side-view of a light source 100 that includes a III-V based pump light source 170 that includes nitrogen, N, and emits light 172 at a first wavelength $\lambda_1$. In some cases, light source 170 has an emission spectrum with one or more peaks with wavelength $\lambda_1$ being the wavelength of a peak emission. In some cases, light source 170 emits light essentially at a single wavelength $\lambda_1$, meaning that the emitted spectrum has a narrow peak at $\lambda_1$ and a small full spectral-width at half maximum (FWHM). In such cases, the FWHM can be less than about 50 nm, or less than about 10 nm, or less than about 5 nm, or less than about 1 nm. In some cases, the pump light source is a III-V laser diode. In some cases, the pump wavelength $\lambda_1$ is between about 350 nm and about 500 nm. For example, in such cases, $\lambda_1$ can be about 405 nm.

Light source 100 also includes a vertical cavity surface emitting laser (VCSEL) 190 that converts at least a portion of first wavelength light 172 emitted by pump light source 170 to at least a partially coherent output light 178 at a second wavelength $\lambda_2$.

VCSEL 190 includes first mirror 120 and second mirror 160 that form an optical cavity for light at the second wavelength. In some cases, the optical thickness of the optical cavity can be an odd integer multiple of half of the second wavelength $\lambda_2$ (that is, $(2m+1)(\lambda_2/2)$, where m is an integer). In such cases, a node of an optical standing wave at $\lambda_2$ within the optical cavity is located at or close to the center of the optical cavity. In some cases, the optical thickness of the optical cavity can be an integer multiple of the second wavelength $\lambda_2$ (that is, $m\lambda_2$, where m is an integer). In such cases, an anti-node of an optical standing wave at $\lambda_2$ within the optical cavity is located at or close to the center of the optical cavity.

In some cases, first mirror 120 is substantially reflective at the second wavelength. For example, in such cases, the reflectance of first mirror 120 at the second wavelength $\lambda_2$ is at least 80%, or at least 90%, or at least 95%, or at least 99%, or at least 99.5%, or at least 99.9%. In some cases, first mirror 120 is substantially transmissive at the first wavelength $\lambda_1$. For example, in such cases, the optical transmittance of first mirror 120 at $\lambda_1$ is at least 50%, or at least 60%, or at least 70%, or at least 80%, or at least 90%.

In some cases, such as in the exemplary light source 100 shown in FIG. 1, first mirror 120 is or includes a first Bragg reflector 120. The Bragg reflector includes a multilayer stack of alternating low index layers 122 having a lower index of refraction and high index layers 124 having a higher index of refraction. In the exemplary light source 100, first Bragg reflector 120 includes four low index layers 122 and four high index layers 124. In general, first Bragg reflector 120 can include one or more low index layers 122 and one or more high index layers 124. For example, in some cases, first Bragg reflector 120 can have at least 5 low index layers and 5 high index layers, or at least 10 low index layers and 10 high index layers, or at least 15 low index layers and 15 high index layers.

In some cases, the optical thickness of at least some of the low and/or high index layers in first Bragg reflector 120 is a quarter of the second wavelength in that layer. In such cases, for a quarter wave thick layer, the physical thickness is $\lambda_2/4n$, where n is the index of refraction of the layer at $\lambda_2$.

First Bragg reflector 120 can include any materials that have suitable lower and higher indices of refraction. Exemplary materials include $SiO_2$, $Si_3N_4$, $TiO_2$, $Ta_2O_5$, $MgF_2$, $CaF_2$, and $HfO_2$. In some cases, first Bragg reflector 120 can include a II-VI material such as ZnSe, ZnS, Cd(Mg)ZnSe, or Mg(Zn)Se, or any combinations or alloys thereof.

In some cases, second mirror 160 is partially reflective at the second wavelength $\lambda_2$. In such cases, the reflectance of second mirror 160 at the second wavelength $\lambda_2$ is at least 80%, or at least 90%, or at least 95%, or at least 99%, or at least 99.5%, or at least 99.9%. In some cases, second mirror 160 is partially transmissive at the second wavelength $\lambda_2$. In such cases, the optical transmittance of the second mirror at the second wavelength is no more than 5%, or no more than 3%, or no more than 2%, or no more than 1%, or no more than 0.5%.

In some cases, such as in the exemplary light source shown in FIG. 1, second mirror 160 is or includes a second Bragg reflector that includes a multilayer stack of alternating low index layers 162 having a lower index of refraction and high index layers 164 having a higher index of refraction. In the exemplary light source 100, second Bragg reflector 160 includes three low index layers 162 and three high index layers 164. In general, second Bragg reflector 160 can include one or more low index layers 162 and one or more high index layers 164. For example, in some cases, second Bragg reflector 160 can have at least 5 low index layers and 5 high index layers, or at least 10 low index layers and 10 high index layers, or at least 15 low index layers and 15 high index layers.

In some cases, the optical thickness of at least some of the low and/or high index layers in second Bragg reflector 160 is a quarter of the second wavelength in that layer. In such cases, the physical thickness is $\lambda_2/4n$, where n is the index of refraction of the layer at $\lambda_2$.

Light source 100 further includes a semiconductor multilayer stack 130 that is disposed between first and second mirrors 120 and 160, respectively. Multilayer stack 130 converts at least a portion of first wavelength light 174 to second wavelength light 176. In some cases, the conversion of light from the first wavelength to the second wavelength can be accomplished when semiconductor multilayer stack 130 absorbs at least a portion of light 174 and re-emits at least a portion of the absorbed light as light 176 at the second wavelength. In some cases, pump light source 170 can emit UV or violet light and the semiconductor multilayer stack 130 can re-emit blue, green, yellow, amber or red light. In some cases, pump light source 170 can emit blue light and the re-emitting semiconductor multilayer stack 130 can re-emit green, yellow, amber or red light.

Semiconductor multilayer stack 130 includes respective first and second windows 132 and 134; and a potential well stack that includes a plurality of alternating potential wells and light absorbing layers. In particular, the exemplary semiconductor multilayer stack 130 includes respective first, second, and third absorbing layers 140, 142, and 144; and respective first and second potential wells 152 and 154.

The light absorbing layers in semiconductor multilayer stack 130 absorb at least a portion of first wavelength light 174 and, resulting response, produce photo-generated carriers, such as photo-generated electron-hole pairs. The carriers diffuse from the light absorbing layers to the neighboring potential wells in the semiconductor multilayer stack, where they recombine radiatively and emit light at the second wavelength $\lambda_2$.

In some cases, such as when the density of the photo-generated electron-hole pairs in semiconductor multilayer stack 130 is sufficiently high, second wavelength light 176 can be amplified as it travels back and forth between mirrors 120 and 160. The amplification occurs primarily in the potential wells where the propagating light assists in the recombination of carriers by means of stimulated emission of light at the second wavelength $\lambda_2$. In such cases, if mirrors 120 and 160 are sufficiently reflective at $\lambda_2$, the mirrors can effectively increase the number of times light 176 passes through the potential wells. As a result, the VCSEL can generate coherent or at least partially coherent light at $\lambda_2$.

In general, re-emitting multilayer stack 130 includes at least one layer of a II-VI compound that is capable of converting at least a portion of a light, such as a blue or UV light, to a longer wavelength light. In some cases, the II-VI wavelength converter includes a II-VI potential or quantum well.

As used herein, potential well means semiconductor layer(s) in a multilayer semiconductor structure designed to confine a carrier in one dimension only, where the semiconductor layer(s) has a lower conduction band energy than the surrounding layers and/or a higher valence band energy than the surrounding layers. Quantum well generally means a potential well which is sufficiently thin that quantization effects increase the energy for electron-hole pair recombination in the well. A quantum well typically has a thickness of about 100 nm or less, or about 10 nm or less.

In some cases, potential or quantum well 152 and/or 154 is a II-VI semiconductor potential or quantum well that has a band gap energy that is smaller than the energy of a photon emitted by pump light source 170. In general, the transition energy of potential or quantum well 152 and/or 154 is substantially equal to the energy of a photon that is re-emitted by the potential or quantum well.

In some cases, potential wells 152 and 154 can include CdMgZnSe alloys having compounds ZnSe, CdSe, and MgSe as the three constituents of the alloy. In some cases, one or more of Cd, Mg, and Zn, especially Mg, may be absent from the alloy. For example, potential wells 152 and 154 can include a $Cd_{0.70}Zn_{0.30}Se$ quantum well capable of re-emitting in the red, or a $Cd_{0.33}Zn_{0.67}Se$ quantum well capable of re-emitting in the green. As another example, potential wells 152 and 154 can include an alloy of Cd, Zn, Se, and optionally Mg, in which case, the alloy system can be represented by Cd(Mg)ZnSe. As another example, potential wells 152 and 154 can include an alloy of Cd, Mg, Se, and optionally Zn. In some cases, the potential wells can include ZnSeTe. In some cases, a quantum well 152 or 154 has a thickness in a range from about 1 nm to about 100 nm, or from about 2 nm to about 35 nm. In some cases, potential wells 152 and 154 can include Be, Hg, O, S or Te, or an alloy of the same.

In some cases, potential wells 152 and 154 are capable of converting at least a portion of light that is emitted by pump light source 170 to a longer wavelength light. In some cases, potential wells 152 and 154 can include a II-VI potential well. In general, potential wells 152 and 154 can have any conduction and/or valence band profile. Exemplary profiles are described in, for example, U.S. Patent Application No. 60/893,804 which is incorporated herein by reference in its entirety.

The separation between neighboring potential wells, such as potential wells 152 and 154, can be any distance that may be practical and/or desirable in an application. For example, in some cases, the first and second potential or quantum wells can be separated by a distance that is about half of the second wavelength $\lambda_2$ in the medium that separates the two potential wells. For example, in such cases, the separation between potential wells 152 and 154 can be $\lambda_2/2n$, where n is the index of refraction of layer 142 at the second wavelength $\lambda_2$.

In some cases, at least a portion of semiconductor multilayer stack 130 is doped with a dopant. For example, in some cases, potential wells 152 and 154 can be n-doped or p-doped where the doping can be accomplished by any suitable method and by inclusion of any suitable dopant, such as Cl, Br, I, Al, Ga, or N.

In some cases, pump light source 170 and semiconductor multilayer stack 130 can be from two different semiconductor groups. For example, in some cases, pump light source 170 can be a III-V semiconductor device and semiconductor multilayer stack 130 can be a II-VI semiconductor device. In some cases, pump light source 170 can include AlGaInN semiconductor alloys and semiconductor multilayer stack 130 can include Cd(Mg)ZnSe semiconductor alloys.

The exemplary semiconductor multilayer stack 130 in FIG. 1 includes two potential wells 152 and 154. In general, semiconductor multilayer stack 130 can have one or more potential or quantum wells. In some cases, semiconductor multilayer stack 130 can have a single potential or quantum well. In some cases, semiconductor multilayer stack 130 can have 2 or more potential wells, or 5 or more potential wells, or 10 or more potential wells. In some cases, at least some or all of the potential wells in the multilayer stack 130 can be located at or near the antinodes of the optical cavity modes at the second or emission wavelength $\lambda_2$.

Light absorbing layers 140, 142 and 144 assist in absorption of light 174 and generation of carriers. The light absorbing layers are placed proximate the potential wells in semiconductor multilayer stack 130 so that the photo-generated carriers can efficiently diffuse to the potential wells for radiative recombination of carriers and emission of light at the second wavelength $\lambda_2$.

In some cases, a light absorbing layer in semiconductor multilayer stack 130 can be immediately adjacent to one or more corresponding potential wells, meaning that no intervening layer is disposed between the absorbing layer and the potential well. For example, first light absorbing layer 140 is immediately adjacent corresponding first potential well 152. As another example, second light absorbing layer 142 is immediately adjacent corresponding potential wells 152 and 154. In some cases, a light absorbing layer in semiconductor multilayer stack 130 can be closely adjacent to a corresponding potential well, meaning that one or a few intervening layers may be disposed between the absorbing layer and the potential well. For example, in some cases, one or more intervening layers can be disposed between first light absorbing layer 140 and corresponding first potential well 152. In such cases, the intervening layers do not substantially block, or interfere with, the diffusion of carriers from absorbing layer 140 to potential well 152. For example, the intervening layers can be sufficiently thin and/or have sufficiently low band gap energies to allow diffusion of carriers from the absorbing layer to the potential well.

In some cases, a light absorbing layer can include a semiconductor, such as an inorganic semiconductor, such as a II-VI semiconductor. For example, one or more of absorbing layers 140, 142 and 144 can include a Cd(Mg)ZnSe semiconductor alloy. In some cases, one or more of absorbing layers 140, 142 and 144 can include Be, Hg, O, S or Te, or an alloy thereof.

In some cases, a light absorbing layer can have a band gap energy that is smaller than the energy of a photon emitted by pump light source 170. In such cases, the light absorbing layer can strongly absorb light that is emitted by the pump light source. In some cases, a light absorbing layer can have a band gap energy that is greater than the transition energy of potential well 140. In such cases, the light absorbing layer is substantially optically transparent to light that is re-emitted by the potential well.

In some cases, at least one light absorbing layer in semiconductor multilayer stack 130 is doped with a dopant. In some cases, the dopant can include chlorine or iodine. In some cases, a light absorbing layer can be n-doped or p-doped where the doping can be accomplished by any suitable method and by inclusion of any suitable dopant. In some cases, the number density of the dopant is in a range from about $10^{17}$ cm$^{-3}$ to about $10^{18}$ cm$^{-3}$. Other exemplary dopants include Al, Ga, In, F, Br, and N.

The exemplary semiconductor multilayer stack 130 includes three light absorbing layers 140, 142 and 144. In general, the semiconductor multilayer stack can have no, one, two, or more than two light absorbing layers. In general, a light absorbing layer is sufficiently close to one or more corresponding potential wells so that a photo-generated carrier in the light absorbing layer has a reasonable chance of diffusing to the potential well. In cases where the semiconductor multilayer stack does not include light absorbing layers, the potential wells can be substantially light absorbing at the first wavelength $\lambda_1$.

First and second windows 132 and 134 are designed primarily to provide barriers so that carriers, such as electron-hole pairs, that are photo-generated in an absorbing layer do not, or have a small chance to, migrate to a free or external surface of, for example, semiconductor multilayer stack 130 where they can recombine non-radiatively. In some cases, windows 132 and 134 have band gap energies that are greater than the energy of a photon emitted by pump light source 170. In such cases, windows 132 and 134 are substantially optically transparent to light emitted by pump light source 170 at the first wavelength $\lambda_1$ and to light that is re-emitted by, for example, first potential well 140 at the second wavelength $\lambda_2$.

Exemplary light source 100 includes two windows. In general, a light source can have no or any number of windows. For example, in some cases, light source 100 can have a single window disposed between pump light source 170 and first potential well 152, or between pump light source 170 and first light absorbing layer 140. In some cases, such as in the exemplary semiconductor multilayer stack 130, at lease one window, such as windows 132 and 134, is an outermost layer of the semiconductor multilayer stack.

In some cases, the location of an interface between two adjacent layers in light source 100 may be a well-defined or sharp interface. In some cases, such as when the material composition within a layer changes as a function of distance along the thickness direction, the interface between two adjacent layers may not be well defined and may, for example, be a graded interface. For example, in some cases, first light absorbing layer 140 and first window 132 can have the same material components but with different material concentrations. In such cases, the material composition of the light absorbing layer may be gradually changed to the material composition of the window layer resulting in a graded interface between the two layers. For example, in cases where both layers include Mg, the concentration of Mg can be increased when gradually transitioning from the absorbing layer to the window.

In some cases, a portion of emitted light 174 can be transmitted by semiconductor multilayer stack 130 as light 174A at the first wavelength $\lambda_1$ which may, in turn, be transmitted, at least partially, by second mirror 160 as light 174B at the first wavelength. In such cases, output light 178 of light source 100 can include light at the first and second wavelengths. For example, in such cases, emitted light 174 can be blue and re-emitted light 176 can be yellow, resulting in a white output light 178.

Light source 100 further includes optional light management optics 180 for managing light 172 emitted by pump light source 170. For example, light management optics 180 can include one or more optical lenses for focusing light 172. Other exemplary light management optics include optical filters, polarizers, beam splitters, dichroic mirrors, and optical fibers.

In the exemplary light source 100, VCSEL 190 is disposed on a heat sink 105. The heat sink cools VCSEL 190 by transferring or conducting heat that is generated in the VCSEL to a different location such as the environment. In some cases, heat sink 105 can be a water-cooling heat sink. In some cases, heat sink 105 can be substantially optically transmissive at the first wavelength $\lambda_1$. For example, in such cases, the optical transmission of heat sink 105 at the first wavelength $\lambda_1$ is at least 50%, or at least 60%, or at least 70%, or at least 80%, or at least 90%.

In general, heat sink 105 can include any material suitable for conducting heat away from VCSEL 190. Exemplary heat sink materials include silicon. Exemplary transparent heat sink materials include silicon carbide, sapphire, and diamond. In some cases, the heat sink can include an opaque material, such as a metal. In such cases, the heat sink can include one or more small transparent or clear openings to allow pump light 174 to pass through.

In general, pump light source 170 can be any light source capable of emitting light at a desired wavelength or in a desired wavelength range. For example, in some cases, pump light source 170 can be an LED emitting incoherent UV, violet or blue light. In some cases, pump light source 170 can be a III-V semiconductor light source, such as a III-V LED, and may include AlGaInN semiconductor alloys. For example, pump light source 170 can be a GaN based LED.

In some cases, pump light source 170 can include one or more p-type and/or n-type semiconductor layers, one or more active layers that may include one or more potential and/or quantum wells, waveguide layers, cladding layers, buffer layers, substrate layers, and superstrate layers.

In some cases, pump light source 170 can be attached or bonded to heat sink 105 or, if, for example, heat sink 105 is absent or is located elsewhere, to first mirror 120. The attachment or bonding can be achieved by any suitable method such as by an adhesive such as a hot melt adhesive, welding, pressure, heat or any combinations of such methods or other methods that may be desirable in an application. Examples of suitable hot melt adhesives include semicrystalline polyolefins, thermoplastic polyesters, and acrylic resins.

Other exemplary bonding materials include optically clear polymeric materials, such as optically clear polymeric adhesives, including acrylate-based optical adhesives, such as Norland 83H (supplied by Norland Products, Cranbury N.J.); cyanoacrylates such as Scotch-Weld instant adhesive (supplied by 3M Company, St. Paul, Minn.); benzocyclobutenes such as Cyclotene™ (supplied by Dow Chemical Company, Midland, Mich.); clear waxes such as CrystalBond (Ted Pella Inc., Redding Calif.); liquid, water, or soluble glasses based on sodium silicate; and spin-on glasses (SOG).

In some cases, pump light source 170 can be attached or bonded to heat sink 105 or to first mirror 120 by, for example, disposing one or more bonding layers between the two during the bonding process. A bonding layer can, for example, include one or more thin or very thin metal layers, one or more thin metal oxide layers, or one or more layers of other materials such as adhesives, encapsulants, high index glasses, or sol-gel materials such as low temperature sol-gel materials, or any combinations thereof.

In general, pump light source 170 can be an incoherent, partially coherent, or coherent light source. For example, in some cases, pump light source 170 can be a coherent pump light source, such as a pump laser such as a pump laser diode, emitting coherent light 172. In some cases, pump light source 170 can be an incoherent pump light source, such as a pump light emitting diode (LED) emitting incoherent light 172. In some cases, such as when mirrors 120 and 160 are highly reflective at $\lambda_2$ and potential wells 152 and 154 provide sufficient gain at $\lambda_2$, light source 100 can be a laser or a coherent light source emitting coherent output light 178. In some cases, output light 178 can be incoherent or partially coherent.

Figure 2:
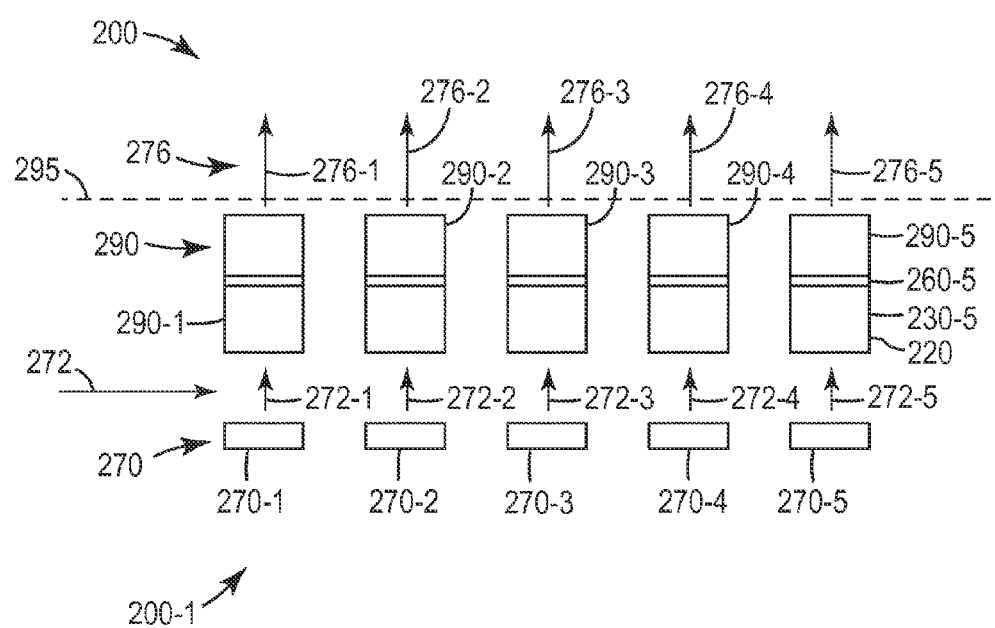
FIG. 2 is a schematic side-view of a light source that includes an array of discrete light sources.

In some cases, pump light source 170 can emit light 172 that includes or displays an image. For example, pump light source 170 can include a one or two dimensional array of discrete light sources that can be individually modulated to form an image. For example, FIG. 2 shows a schematic side-view of a light source 200 that includes an array of discrete light sources 200-1, where at least one discrete light source includes a discrete pump light source and a discrete VCSEL. In particular, the exemplary light source 200 includes an array of discrete pump light sources 270 emitting a corresponding array of emitted lights 272, and a corresponding array of discrete VCSELs 290 re-emitting a corresponding array of re-emitted lights 276. In the exemplary light source 200, array 270 includes discrete pump light sources 270-1 through 270-5 emitting respective pump lights 272-1 through 272-5, and array 290 includes VCSEL 290-1 through 290-5 re-emitting respective lights 276-1 through 276-5. For example, VCSEL 290-1 absorbs at least a portion of emitted pump light 272-1 and re-emits at least a portion of the absorbed light as light 276-1 at a longer wavelength.

In some cases, at least some of the discrete pump light sources emit light in different color regions of the spectrum. For example, emitted pump light 272-1 can be a UV light and emitted pump light 272-3 can be a blue light. In some cases, all the discrete pump light sources can emit light in the same color region of the spectrum. For example, all the discrete pump light sources can emit blue light. In some cases, the wavelengths of the pump lights that are emitted in the same color region are substantially equal. For example, in such cases, the difference between the emitted wavelengths is no more than about 50 nm, or about 40 nm, or about 30 nm, or about 20 nm, or about 10 nm, or about 7 nm, or about 5 nm.

In some cases, at least some of the re-emitted lights 276-1 through 276-5 can have different wavelengths. For example, re-emitted light 276-1 can be a blue light, re-emitted light 276-3 can be a green light, and re-emitted light 276-5 can be a red light.

In some cases, light source 200 can include a discrete pump light source without a corresponding VCSEL. For example, Light source 200 can include discrete pump light source 270-1, but VCSEL 290-1 may be absent in the light source. In such cases, the light emitted by pump light source 270-1 can be part of the overall light emitted by light source 200. As another example, pump light source 270-1 can emit blue light and not have a corresponding VCSEL, pump light source 270-2 can emit blue light with corresponding VCSEL 290-2 re-emitting green light, and pump light source 270-3 can emit blue light with corresponding VCSEL 290-3 re-emitting red light. In such cases, emitted blue light 272-1, re-emitted green light 276-2, and re-emitted red light 276-3 can combine to produce white light. In such cases, pump light sources 270-1, 270-2 and 270-3 can be part of a same pixel in light source 200 with each individual pump light source being part of a sub-pixel.

Referring back to FIG. 1, light source 100 can be included in a display. For example, a pixel in a pixelated display that is capable of displaying a pixelated image, can include light source 100. In some cases, each pixel in a pixelated display can include a light source similar to light source 100, where in some pixels, the semiconductor multilayer stack may be absent.

In some cases, the discrete pump light sources in array 270 can be modulated independently to form an emitted image, for example, in blue. The discrete VCSELs in array of VCSELs 290 can convert the emitted image into a re-emitted pixelated image at a surface, such as surface 295, of light source 200. In some cases, the re-emitted pixelated image can be a monochromatic (for example, green or green and black) image. In some cases, the re-emitted pixelated image can be a color image. In the context of a display system, a discrete light source in light source 200 can be, for example, a pixel or a sub-pixel.

In general, the array of discrete light sources in light source 200 can be any type array desirable in an application. In some cases, the array can be a row or a column, such as a 1×n array where n is 2 or greater. In some cases, the array can be a square array, such as an m×m array, or a rectangular array, such as an m×n array where n and m are both 2 or greater and m is different than n. In some cases, the array can be a trapezoidal array, a hexagonal array, or any other type array, such as any regular or irregular type array.

In some cases, the discrete light sources in the array (or pixels in the array in the context of a display system) can be of equal size, or have different sizes, for example, to account for differences in conversion efficiency of different colors.

A discrete light source in an array of discrete light sources can have any shape such as, square, oval, rectangular, or more complex shapes to accommodate, for example, optical and electrical functions of a device incorporating the array. The discrete light sources in an array can be placed in any arrangement that may be desirable in an application. For example, the elements can be uniformly spaced, for example, in a rectangular or hexagonal arrangement. In some cases, the elements can be placed non-uniformly, for example, to improve device performance by, for example, reducing or correcting optical aberrations such as pincushion or barrel distortions.

Light sources disclosed in this application can be fabricated using methods commonly used in, for example, fabrication of microelectronic and semiconductor devices and other wafer-based devices. Known methods include molecular-beam epitaxy (MBE), metal-organic vapor-phase epitaxy (MOVPE), physical vapor deposition (PVD), chemical vapor deposition (CVD), metal-organic vapor phase deposition (MOCVD), liquid phase epitaxy (LPE), vapor phase epitaxy (VPE), photolithography, wafer bonding, deposition methods and etching methods. An exemplary process for fabricating a light source similar to light source 100 is schematically outlined in reference to FIGS. 3A-3E.

Figure 3A:
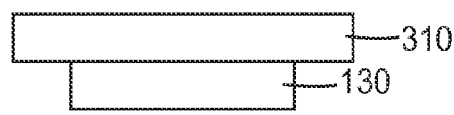
FIG. 3A-3E are schematic representations of devices at intermediate stages or steps in a process for fabricating a light source.

First, semiconductor multilayer stack 130 is fabricated on a substrate 310 as shown schematically in FIG. 3A where the details of stack 130, some of which are shown in FIG. 1, are not shown in FIG. 3A for ease of viewing. Substrate 310 can be any substrate that may be suitable and/or desirable in an application. For example, substrate 310 can be a sapphire substrate, a SiC substrate, a GaN substrate, or an InP substrate.

In some cases, semiconductor multilayer stack 130 is grown pseudomorphically on InP, meaning that the lattice constant of at least one layer in stack 130, such as a layer that is immediately adjacent substrate 310, is sufficiently similar to the lattice constant of a crystalline substrate 310 so that when fabricating or growing the semiconductor multilayer stack on the substrate, the multilayer stack can adopt the lattice spacing of the substrate with no or low density of misfit defects. In such cases, the lattice constant of at least some of the layers in semiconductor multilayer stack 130 can be constrained to the lattice constant of the substrate.

In some cases, semiconductor multilayer stack 130 is or includes a layer that is lattice matched to substrate 310, meaning that the lattice constant of a crystalline semiconductor multilayer stack 130 is substantially equal to the lattice constant of a crystalline substrate 310 where by substantially equal it is meant that the two lattice constants are not more than about 0.2%, or not more than about 0.1%, or not more than about 0.01%, different from each other. In some cases, such as when substrate 310 includes InP, semiconductor multilayer stack 130 can be lattice matched to InP.

Figure 3B:
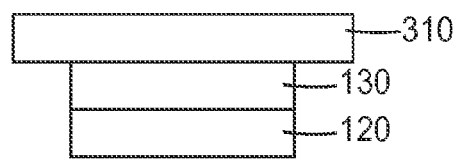

Next, first mirror 120 is fabricated on semiconductor multilayer stack 130 as shown schematically in FIG. 3B, where the details of first mirror 120, some of which are shown in FIG. 1, are not shown in FIG. 3B for ease of viewing. The different layers in first mirror 120 can be fabricated on semiconductor multilayer stack 130 using, for example, chemical and/or physical vapor deposition methods. In some cases, a highly reflecting metal layer can be included in first mirror 120.

Figure 3C:
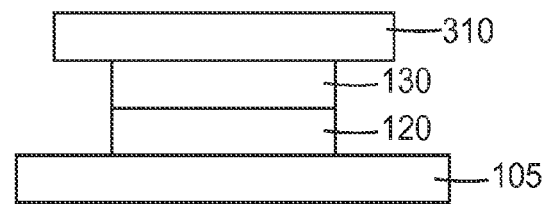

Next, heat sink 105 is attached to first mirror 120 as shown schematically in FIG. 3C. Heat sink 105 includes a material with a high thermal conductivity such as a metal. The attachment may be made using any suitable method, such as solder bonding, direct wafer bonding, or adhesive bonding.

Figure 3D:
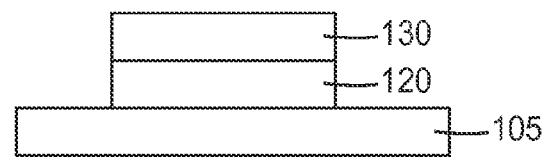

Next, substrate 310 is removed from the construction shown in FIG. 3C resulting in the construction shown schematically in FIG. 3D. Substrate 310 can be removed using any suitable removing method, such as wet or dry etching methods. For example, an InP substrate 310 can be removed by etching the substrate in, for example, an HCl solution at room or an elevated temperature. As another example, a Ge substrate can be removed by etching the substrate in, for example, a $CF_4/O_2$ plasma as described in, for example, R. Venkatasubramanian, et al., "Selective Plasma Etching of Ge Substrates for Thin Freestanding GaAs—AlGaAs Heterostructures," Appl. Phys. Lett. Vol. 59, p. 2153 (1991). As another example, a GaAs substrate can be removed by etching the substrate in, for example, a solution of $NH_4OH$ and sufficiently concentrated $H_2O_2$ at room or an elevated temperature and, for example, with aggressive agitation.

Figure 3E:
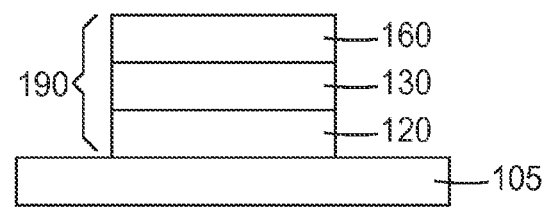

Next, second mirror 160 is fabricated on semiconductor multilayer stack 130 resulting in the construction shown schematically in FIG. 3E, where the details of second mirror 160, some of which are shown in FIG. 1, are not shown in FIG. 3E for ease of viewing. The different layers in second mirror 160 can be fabricated on semiconductor multilayer stack 130 using, for example, chemical and/or physical vapor deposition methods.

It should be appreciated that the fabrication process described in FIGS. 3A-3E is an exemplary process and other methods can be employed to fabricate the constructions disclosed in this application. Furthermore, it should be appreciated that the fabrication steps described in FIGS. 3A-3E may include additional steps. For example, the fabrication process may include one or more intermediate steps in between any two disclosed sequential steps.

Figure 4:
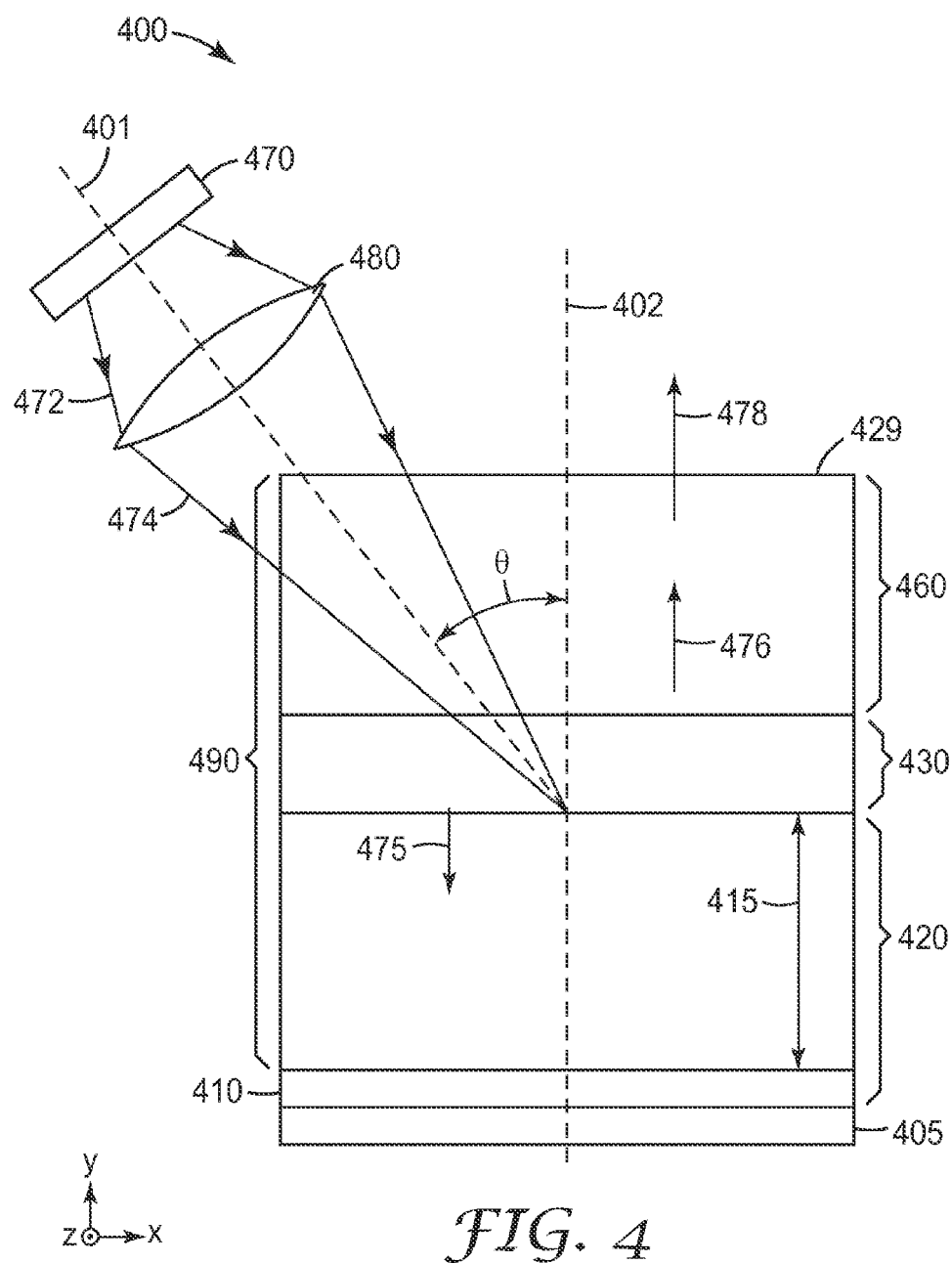
FIG. 4 is a schematic side-view of another light source.

In the exemplary light source 100 of FIG. 1, pump light source 170, VCSEL 190, and light management optics 180 are co-linear and centered on a same axis 195 (parallel to the y-axis). The pump light is incident on an input surface, such as input surface 128, of the VCSEL. Converted light 178 is emitted, or exits, from an output or exit surface, such as output surface 129, of the VCSEL, where output surface 129 is opposite to and different from input surface 128. In general, different components or portions of light source 100 can be centered on different axes. For example, FIG. 4 is a schematic side-view of a light source 400 having a pump light source 470 similar to pump light source 170, a light management optics 480 similar to light management optics 180, a VCSEL 490 similar to VCSEL 190, and a heat sink 405 similar to heat sink 105, where a portion of light source 400 is located on first axis 401 and another portion of light source 400 is located on second axis 402.

Pump light source 470 and light management optics 480 are centered on axis 401. Pump light source 470 emits light 472 at the first wavelength $\lambda_1$ that is generally centered on and propagates along axis 401. Light management optics 480 focus light 472 as light 474 generally centered on and propagating along axis 401.

VCSEL 490 is centered on second axis 402, where axis 402 makes an angle θ with axis 401. VCSEL 490 converts at least a portion of incident light 474 at the first wavelength $\lambda_1$ to a converted output light 478 at the longer wavelength $\lambda_2$ that is generally centered on and propagates along axis 402.

VCSEL 490 is disposed on a heat sink 405 similar to heat sink 105 and includes a first mirror 420, a semiconductor multilayer stack 430 similar to semiconductor multilayer stack 130, and a second mirror 460 similar to second mirror 160.

Incident or pump light 474 enters the VCSEL from an input surface 429 of the VCSEL and converted, re-emitted, or exit light 478 exits VCSEL from the same surface. In the exemplary light source 400, the input surface of the VCSEL is the same as the output surface of the VCSEL. In the exemplary light source 400, first mirror 420 need not be optically transmissive to incident light 474 since incident light 474 is primarily reflected, and not transmitted, by first mirror 420. First mirror 420 includes a reflective multilayer stack 415, similar to first mirror 120, disposed on an optional highly reflective metal layer 410. In some cases, reflective metal layer 410 can be optically opaque at the first wavelength $\lambda_1$.

In some cases, optional metal reflector 410 can increase the reflectivity of first mirror 420. In some cases, metal reflector 410 can include, for example, Al, Ag, Au, or any combination thereof. In some cases, the optical reflectance of metal reflector 410 at the second wavelength $\lambda_2$ is at least 50%, or at least 60%, or at least 70%, or at least 80%, or at least 90%.

In some cases, metal reflector 410 layer can reduce the number of layers, such as dielectric layers, that are needed to achieve a desired overall reflectivity for mirror 420. In such cases, the thermal conductance between semiconductor multilayer stack 430 and heat sink 405 can be improved because of the reduced separation between the two components. In some cases, a portion of the incident light at the first wavelength that is reflected by first mirror 420, can be reflected back by semiconductor multilayer stack 430 as light 475. In such cases, metal reflector 410 can recycle light 475 by reflecting at least a portion of the light back towards the semiconductor multilayer stack so that the light can be absorbed by the semiconductor multilayer stack, thereby increasing the overall conversion efficiency of the VCSEL.

Semiconductor multilayer stack 430 absorbs at least a portion of light 474 at the first wavelength and re-emits at least a portion of the absorbed light as light 476 at the second wavelength $\lambda_2$, where light 476 is generally centered on and propagates along axis 402. Converted light 476 is, at least partially, transmitted by second mirror 460 as output light 478. In some cases, output light 478 of light source 400 can include lights at both the first and second wavelengths. In some cases, the absorption of semiconductor multilayer stack 430 and/or the reflectance of second mirror 460 at the first wavelength can be sufficiently high so that output light 478 has no or very little light at the first wavelength.

In the exemplary light source 100 of FIG. 1, VCSEL 190 includes respective first and second end mirrors 120 and 160 directly disposed on opposite sides of semiconductor multilayer stack 130 where the two end mirrors form an optical cavity for light at the second wavelength $\lambda_2$. In some cases, an end mirror in a VCSEL can be separated or spaced apart from the semiconductor multilayer stack as shown in FIG. 5.

Figure 5:
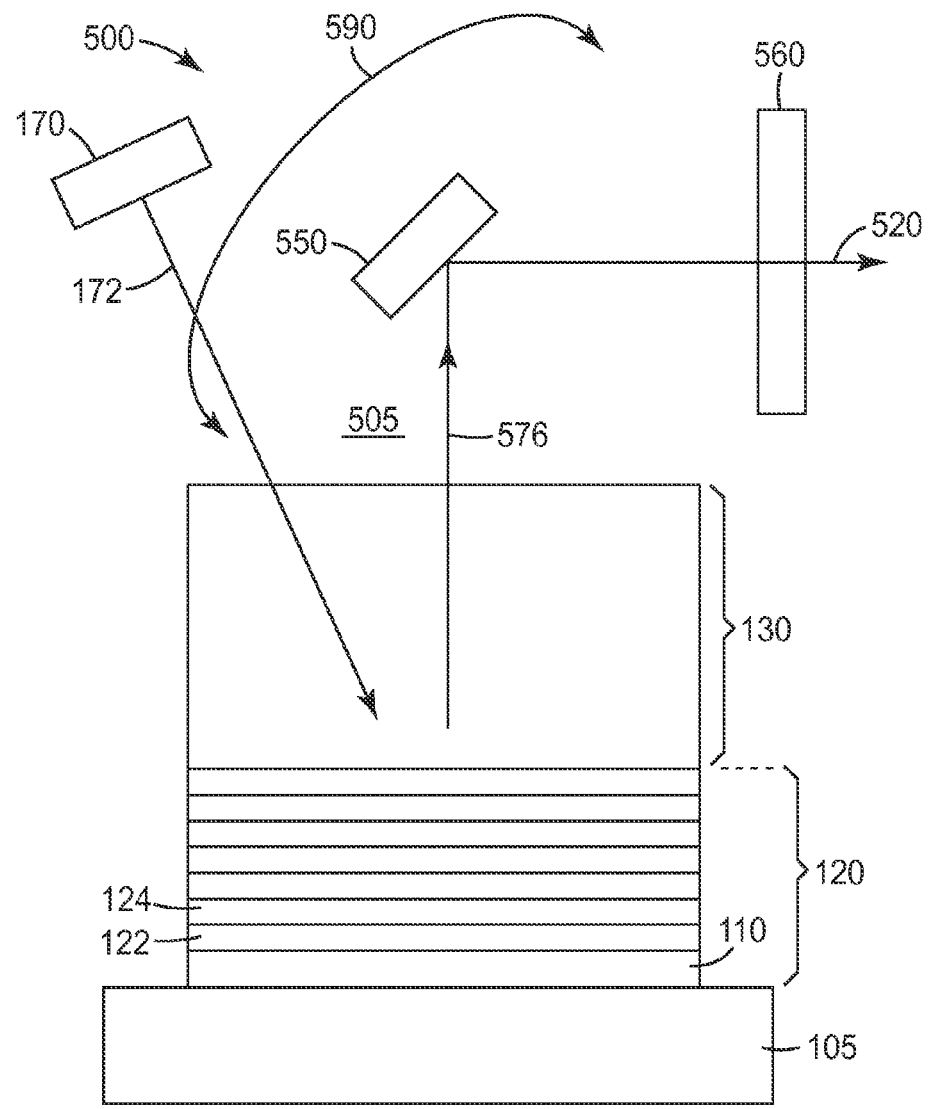
FIG. 5 is a schematic side-view of another light source.

FIG. 5 is a schematic side-view of a light source 500 that includes pump light source 170 emitting light 172 at the first wavelength $\lambda_1$, heat sink 105, and a VCSEL 590 that includes first end mirror 120, semiconductor multilayer stack 130 disposed on the first end mirror, an optional turning mirror 550, and a second end mirror 560, where the two end mirrors form an optical cavity for light at $\lambda_2$. In some cases, turning mirror 550 can be a dichroic turning mirror. Second end mirror 560 is separated or spaced apart from semiconductor multilayer stack 130 by a gap 505. In some cases, gap 505 between end mirrors 120 and 560 can include an air gap. An advantage of light source 500 is that one or more additional optional optical components, such as turning mirror 550, can be included inside the optical cavity. Other exemplary optional optical components include optical filters, polarizers, lenses, dichroic mirrors, and the like.

Semiconductor multilayer stack 130 absorbs at least a portion of light 172 and re-emits at least a portion of the absorbed light as light 576 at the second wavelength $\lambda_2$. Light 576 at the second wavelength is redirected by dichroic turning mirror 550 towards second end mirror 560. Second end mirror 560 is, at least functionally, similar to second mirror 160 and is partially transmissive and partially reflective at the second wavelength $\lambda_2$. A portion of light at the second wavelength is transmitted by the second end mirror as output light 520 emitted by light source 500.

In some cases, semiconductor multilayer stack 130 includes a quantum well that includes a Cd(Mg)ZnSe alloy. In some cases, second end mirror 560 can have an additional optical function, such as an optical power for, for example, focusing light 576 or 520.

Figure 6:
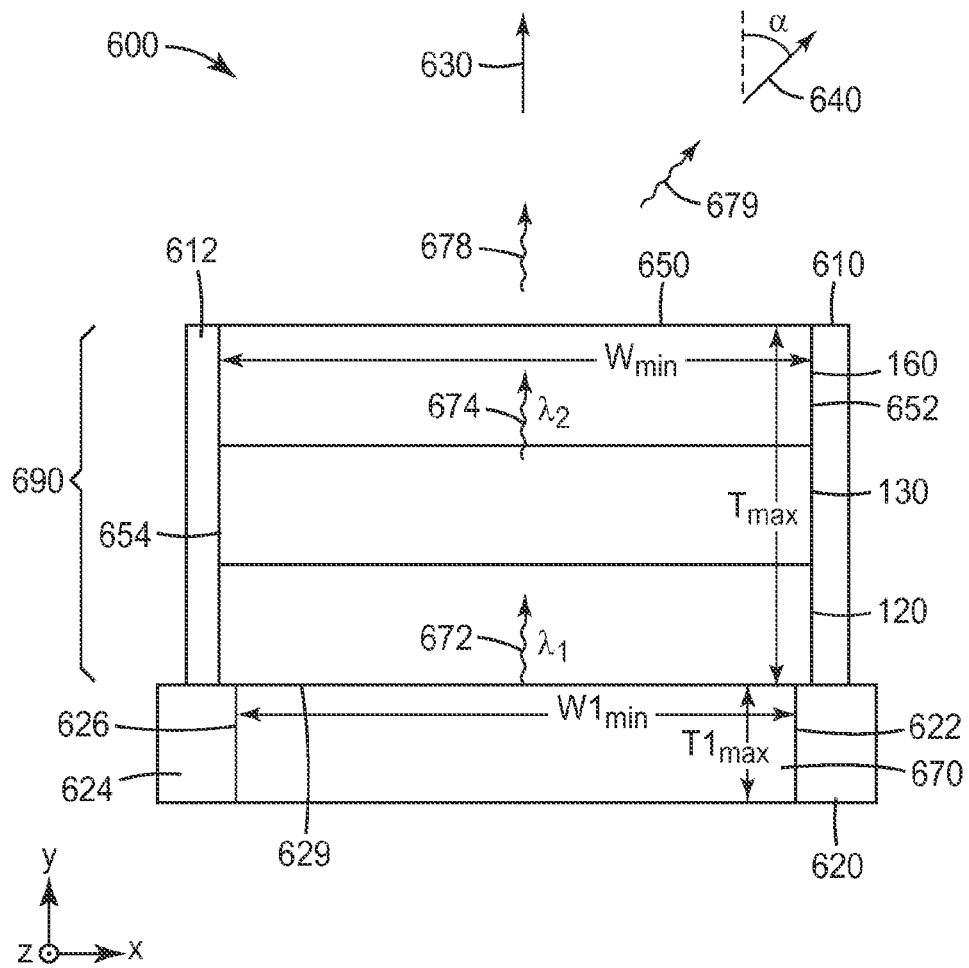
FIG. 6 is a schematic side-view of a light emitting system.

FIG. 6 is a schematic side-view of a light emitting system 600 that includes an optical cavity 690 that is similar to VCSEL 190 and is bonded to an electroluminescent device 670 that is similar to pump light source 170. In some cases, electroluminescent device 670 can be a coherent laser diode (LD) or an incoherent light emitting diode (LED). Electroluminescent device 670 emits light 672 at the first wavelength $\lambda_1$. Optical cavity 690 includes first mirror 120, semiconductor multilayer stack 130, and second mirror 160. Semiconductor multilayer stack 130 receives at least a portion of light 672 at the first wavelength, and converts at least a portion of the received light 674 at the second wavelength $\lambda_2$. At least a portion of re-emitted or converted light to light 674 is transmitted by second mirror 160 as output light 678.

In some cases, light 678 that exits light emitting system 600 is substantially monochromatic, meaning that the exiting light is substantially light at the second wavelength $\lambda_2$ and includes little or no first wavelength light at $\lambda_1$. In such cases, the integrated or total emission intensity of all light at the second wavelength $\lambda_2$ that exit light emitting system 600 is at least 4 times, or at least 10 time, or at least 20 times, or at least 50 times, the integrated or total emission intensity of all light at the first wavelength $\lambda_1$ that exit light emitting system 600. Integrated emission intensity of light emitting system 600 can be determined by integrating the output intensity of the system at one or more wavelengths over all emission angles and directions which, in some cases, can be 4π square radians or 4π steradians.

In some cases, a portion of any unconverted light at the first wavelength $\lambda_1$ may exit light emitting system 600 and become part of the output light. In such cases, output light 678 can include light at both wavelengths $\lambda_1$ and $\lambda_2$. In such cases, light exiting light emitting system 600 along different directions can have different spectral, such as color, properties. For example, light traveling along different directions can have different proportions of the first and second wavelengths light. For example, output light 678 can propagate substantially along a first direction 630 (y-axis) and output light 679 can propagate substantially along a second direction 640. In some cases, lights 678 and 679 can have different spectral properties. For example, light 678 can have a larger second wavelength content than light 679. In some cases, optical cavity 690 enhances emission of light from an active top surface 650 of the light emitting system and suppresses emission of light from one or more sides of the light emitting system, such as sides 652 and 654 of the optical cavity. In such cases, output lights 678 and 679 can have substantially the same spectral characteristics. For example, in such cases, light 678 can have a first color $C_1$ with CIE color coordinates $u_1'$ and $v_1'$ and color coordinates $x_1$ and $y_1$ and light 679 can have a second color $C_2$ with color coordinates $u_2'$ and $v_2'$ and color coordinates $x_2$ and $y_2$, where colors $C_1$ and $C_2$ are substantially the same. In such cases, the absolute value of each of the differences between $u_1'$ and $u_2'$ and between $v_1'$ and $v_2'$ is no more than 0.01, or no more than 0.005, or no more than 0.004, or no more than 0.003, or no more than 0.002, or no more than 0.001, or no more than 0.0005; and the difference $\Delta(u',v')$ between colors $C_1$ and $C_2$ is no more than 0.01, or no more than 0.005, or no more than 0.004, or no more than 0.003, or no more than 0.002, or no more than 0.001, or no more than 0.0005. In some cases, the angle α between directions 630 and 640 is not less than about 10 degrees, or not less than about 15 degrees, or not less than about 20 degrees, or not less than about 25 degrees, or not less than about 30 degrees, or not less than about 35 degrees, or not less than about 40 degrees, or not less than about 45 degrees, or not less than about 50 degrees, or not less than about 55 degrees, or not less than about 60 degrees, or not less than about 65 degrees, or not less than about 70 degrees.

As used herein, an active top surface 650 means that portion of the top surface of the light emitting system through which light is emitted. Active top surface 650 has a minimum lateral dimension $W_{min}$. In some cases, $W_{min}$ can be in a range from about 50 μm to about 1000 μm, or from about 100 μm to about 600 μm, or from about 200 μm to about 500 μm. In some cases, $W_{min}$ can be about 250 μm, or about 300 μm, or about 350 μm, or about 4000 μm, or about 4500 μm. In some cases, the minimum width $W_{min}$ can be in a range from about 1 μm to about 50 μm, or from about 1 μm to about 40 μm, or from about 1 μm to about 30 μm.

The sides, such as sides 652 and 654, of optical cavity 690 define an exit aperture having a maximum height $T_{max}$, where, in some cases, $T_{max}$ can be the maximum edge thickness of the optical cavity. The sides, including for example sides 652 and 654, of the optical cavity define a largest exit or clear aperture having a maximum height $T_{max}$ through which light at the first wavelength $\lambda_1$ can exit the optical cavity. In general, $T_{max}$ corresponds to the sum of the thicknesses of the various layers in the optical cavity that are at least substantially optically transparent at $\lambda_1$. In some cases, $T_{max}$ corresponds to the sum of the thicknesses of all of the semiconductor layers in the optical cavity. In some cases, $T_{max}$ corresponds to the maximum edge thickness of the optical cavity excluding the edge portions that are not transparent at $\lambda_1$. In some cases, $T_{max}$ is in a range from about 1 μm to about 1000 μm, or from about 2 μm to about 500 μm, or from about 3 μm to about 400 μm. In some cases, $T_{max}$ is about 4 μm, or about 10 μm, or about 20 μm, or about 50 μm, or about 100 μm, or about 200 μm, or about 300 μm.

In some cases, the ratio $W_{min}/T_{max}$ is large enough so that optical cavity 690 enhances emission of light from active top surface 650 of light emitting system 600 and suppresses emission of light from sides 652 and 654 of the optical cavity. For example, in such cases, the ratio $W_{min}/T_{max}$ is at least about 30, or at least about 40, or at least about 50, or at least about 70, or at least about 100, or at least about 200, or at least about 500.

In some cases, emission through sides of optical cavity 690 can be suppressed by placing a light blocking construction 610 along side 652 and a light blocking construction 612 along side 654. Light blocking constructions 610 and 612 can block light that propagates side ways in the optical cavity by any means that may be desirable and/or available in an application. For example, in some cases, light blocking constructions 610 and 612 can block the light primarily by absorbing the light. In some other cases, light blocking constructions 610 and 612 can block the light primarily by reflecting the light. In some cases, the constructions block the light partly by absorption and partly by reflection.

In some cases, emission through sides of the light emitting system, such as sides 622 and 626 of electroluminescent device 670, can be further suppressed by placing a light blocking construction 620 along side 622 of electroluminescent device 670 and a light blocking construction 624 along side 626 of the electroluminescent device. In such cases, a substantial portion of the first wavelength light that exits electroluminescent device 670 and is received by optical cavity 690, exits the electroluminescent device through an active top surface 629 of the electroluminescent device. For example, in such cases, at least 50%, or at least 60%, or at least 70%, or at least 80%, or at least 90%, or at least 95%, or at least 98% of first wavelength light 672 that exits electroluminescent device 670 and is received by optical cavity 690, exits the electroluminescent device through active top surface 629 of the electroluminescent device.

Sides 622 and 626 of electroluminescent device 670 define an exit aperture having a maximum height $T1_{max}$, where, in some cases, $T1_{max}$ can be the maximum edge thickness of the electroluminescent device. The sides, including for example sides 622 and 626, of the electroluminescent device define a largest exit or clear aperture having a maximum height $T_{max}$ through which light at the first wavelength $\lambda_1$ can exit the electroluminescent device. In general, $T_{max}$ corresponds to the sum of the thicknesses of the various layers in the electroluminescent device that are at least substantially optically transparent at $\lambda_1$. In some cases, $T_{max}$ corresponds to the sum of the thicknesses of all of the semiconductor layers in the electroluminescent device. In some cases, $T_{max}$ corresponds to the maximum edge thickness of the electroluminescent device excluding the edge portions that are not transparent at $\lambda_1$. In some cases, $T1_{max}$ is in a range from about 1 μm to about 1000 μm, or from about 2 μm to about 500 μm, or from about 3 μm to about 400 μm. In some cases, $T1_{max}$ is about 4 μm, or about 10 μm, or about 20 μm, or about 50 μm, or about 100 μm, or about 200 μm, or about 300 μm.

Active top surface 629 has a minimum lateral dimension $W1_{min}$. In some cases, $W1_{min}$ can be in a range from about 50 μm to about 1000 μm, or from about 100 μm to about 600 μm, or from about 200 μm to about 500 μm. In some cases, $W1_{min}$ can be about 250 μm, or about 300 μm, or about 350 μm, or about 4000 μm, or about 4500 μm. In some cases, the minimum width $W1_{min}$ can be in a range from about 1 μm to about 50 μm, or from about 1 μm to about 40 μm, or from about 1 μm to about 30

In some cases, the ratio $W1_{min}/T1_{max}$ is large enough so that electroluminescent device 670 enhances emission of light from active top surface 650 of light emitting system 600 and suppresses emission of light from the sides of the light emitting system, such as sides 622 and 626 of the electroluminescent device. For example, in such cases, the ratio $W1_{min}/T1_{max}$ is at least about 30, or at least about 40, or at least about 50, or at least about 70, or at least about 100, or at least about 200, or at least about 500.

Other exemplary methods for enhancing emission of light from active top surface 650 of light emitting system 600 and suppressing emission of light from the sides of the light emitting system are described in U.S. Patent Application Ser. No. 61/094,180, filed Sep. 4, 2008, which is incorporated herein in its entirety by reference.

Figure 7:
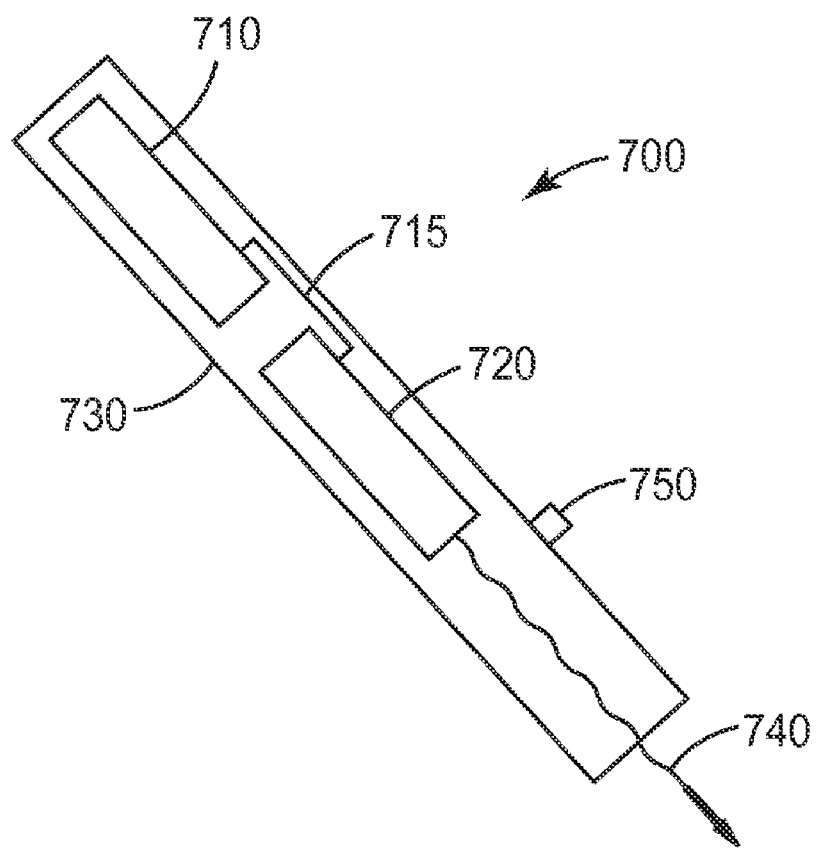
FIG. 7 is a schematic view of a light pointer.

FIG. 7 is a schematic light pointer 700 that includes a housing 730 that houses a battery 710 for energizing a light source 720 via an electrical connection 715. Once energized, light source 720 emits output light 740 that can point to a desired location or designate a desired spot. Light source 720 can be any disclosed light source, such as light source 100 or 400. In some cases, light source 720 can be a laser diode. In such cases, light pointer 700 can be a laser pointer 700.

In some cases, light pointer 700 can be handheld, meaning that it can be held in a user's hand with relative ease and convenience. In such cases, the user can energize light pointer 700 by, for example, operating, such as pressing, a button 750. In some cases, light pointer 700 can be pen-like, meaning that it can, for example, look like a writing instrument, such as a pen or pencil.

As used herein, terms such as "vertical", "horizontal", "above", "below", "left", "right", "upper" and "lower", "top" and "bottom" and other similar terms, refer to relative positions as shown in the figures. In general, a physical embodiment can have a different orientation, and in that case, the terms are intended to refer to relative positions modified to the actual orientation of the device. For example, even if the construction in FIG. 1 is flipped vertically as compared to the orientation in the figure, second mirror 160 is still considered to be a top end mirror and first mirror 120 is still considered to be a bottom end mirror.

While specific examples of the invention are described in detail above to facilitate explanation of various aspects of the invention, it should be understood that the intention is not to limit the invention to the specifics of the examples. Rather, the intention is to cover all modifications, embodiments, and alternatives falling within the spirit and scope of the invention as defined by the appended claims.

What is claimed is:

1. A light emitting system, comprising:
an electroluminescent device emitting light at a first wavelength; and
an optical cavity enhancing emission of light from a top surface of the light emitting system and suppressing emission of light from one or more sides of the light emitting system, the optical cavity comprising a semiconductor multilayer stack receiving the emitted first wavelength light and converting at least a portion of the received light to light of a second wavelength, the semiconductor multilayer stack comprising a II-VI potential well;
wherein an integrated emission intensity of all light at the second wavelength exiting the light emitting system is at least 10 times an integrated emission intensity of all light at the first wavelength exiting the light emitting system.

2. The light emitting system of claim 1, wherein the II-VI potential well comprises Cd(Mg)ZnSe or ZnSeTe.

3. The light emitting system of claim 1, wherein the electroluminescent device is so designed that a substantial portion of the first wavelength light that is received by the semiconductor multilayer stack, exits the electroluminescent device through a top surface of the electroluminescent device.

4. The light emitting system of claim 1, wherein light emitted by the light emitting system along a first direction has a first set of color coordinates, and light emitted by the light emitting system along a second direction different than the first direction has a second set of color coordinates, the second set of color coordinates being substantially the same as the first set of color coordinates.

5. The light emitting system of claim 4, wherein the first set of color coordinates are $u_1'$ and $v_1'$ and the second set of color coordinates are $u_2'$ and $v_2'$, and wherein an absolute value of each of differences between $u_1'$ and $u_2'$ and between $v_1'$ and $v_2'$ is no more than 0.003.

6. The light emitting system of claim 1, wherein the integrated emission intensity of all light at the second wavelength exiting the light emitting system is at least 50 times the integrated emission intensity of all light at the first wavelength exiting the light emitting system.

7. The light emitting system of claim 1, wherein the electroluminescent device comprises an LED emitting incoherent light.

8. The light emitting system of claim 1, wherein the electroluminescent device comprises a laser diode emitting at least partially coherent light.

9. The light emitting system of claim 1, wherein:
a primary portion of the re-emitted second wavelength light exits the light emitting system from a top surface of the light emitting system having a minimum lateral dimension $W_{min}$, and a substantial fraction of the remaining portion of the re-emitted second wavelength light exits the light emitting system from one or more sides of the optical cavity having a maximum edge thickness $T_{max}$, the ratio $W_{min}/T_{max}$ being at least about 30; and wherein:

a primary portion of the emitted first wavelength light exits the electroluminescent device from a top surface of the electroluminescent device having a minimum lateral dimension $W1_{min}$, and the remaining portion of the emitted first wavelength light exits the electroluminescent device from one or more sides of the electroluminescent device having a maximum edge thickness $T1_{max}$, the ratio $W1_{min}/T1_{max}$ being at least about 30.

10. The light emitting system of claim 9, wherein each of the ratios $W_{min}/T_{max}$ and $W1_{min}/T1_{max}$ is at least about 100.

11. A light pointer comprising the light source of claim 1.

12. The light pointer of claim 11 being a laser pointer.

13. The light pointer of claim 11 being a handheld light pointer.

14. The light pointer of claim 11 further comprising a battery for operating the light pointer.

* * * * *